United States Patent [19]

Teter et al.

[11] Patent Number: 5,039,894
[45] Date of Patent: Aug. 13, 1991

[54] MAGNETOSTRICTIVE LINEAR MOTOR

[75] Inventors: Joseph P. Teter, Silver Spring; Arthur E. Clark, Adelphi, both of Md.

[73] Assignee: The United States of America as represented by the Secretary of the Navy, Washington, D.C.

[21] Appl. No.: 607,350

[22] Filed: Oct. 11, 1990

[51] Int. Cl.$^5$ .............................................. H01L 41/12
[52] U.S. Cl. .......................................... 310/26; 310/12; 310/17; 318/118
[58] Field of Search ............... 310/26, 14, 30, 66, 310/67 R, 254, 17, 12; 318/118; 73/630

[56] References Cited

U.S. PATENT DOCUMENTS

| 2,105,479 | 1/1938 | Haynes | 73/630 |
| 3,304,479 | 2/1967 | Kleesattel et al. | 318/118 |
| 3,419,739 | 12/1968 | Clements | 310/12 |
| 3,439,199 | 4/1969 | Bergstrand et al. | 310/26 |
| 3,634,742 | 1/1972 | Edson | 310/26 |
| 4,017,754 | 4/1977 | Jarrett et al. | 310/26 |
| 4,831,290 | 5/1989 | Clauss et al. | 310/12 |
| 4,927,334 | 5/1990 | Engdahl et al. | 310/26 |

FOREIGN PATENT DOCUMENTS 796221  6/1958  United Kingdom ............... 310/26

Primary Examiner—Steven L. Stephan
Assistant Examiner—Edward H. To
Attorney, Agent, or Firm—Kenneth E. Walden; Jacob Shuster

[57] ABSTRACT

The magnetostrictive rod of a linear motor is made of twinned single crystal Terfenol-D having its crystalline axis aligned with the rod axis to produce non-uniform transverse magnetostriction during axial magnetostrictive elongation of the rod in response to a triggering magnetic field. Slide bearing forces applied through spring biased support plates are limited to flat surfaces formed on the rod perpendicular to a transverse axis along which the rod is magnetostrictively contracted.

16 Claims, 3 Drawing Sheets

MAGNETOSTRICTIVE LINEAR MOTOR

BACKGROUND OF THE INVENTION

This invention relates generally to motors or actuators through which electrical energy is converted into mechanical energy by magnetostriction.

Linear motors based on electrostriction operating principles are well known and are similar in operation to magnetostrictive types of linear motors. In a magnetostrictive linear motor, an active element is movable in one direction of motion relative to a container associated with its stator. The movable element is tightly held in the container while the motor is deenergized. The stator also has already associated therewith an electromagnetically energized coil for generating a magnetic field that is oriented in the direction of motion imparted to the movable element. In continuous motion types of motors, having relatively small strokes, the movable element is maintained clamped to its stator at one axial location in the direction of motion. In motors producing discontinuous motion, the movable element is either clamped to the stator at two or more axial locations or the clamping location is changed during operation.

The use of polycrystalline Terfenol-D as a most desirable magnetostriction material has already been proposed for the movable element of magnetostrictive linear motors. Such active element material is magnetostrictively elongated by a localized magnetic field swept along the direction of motion as the element shrinks from the inner wall surface of its stator support lube by contracting uniformly in directions transverse to its motion. The movable element clamped to the stator support tube in the static condition of such motors is under randomly applied radial stress in multi-axis directions.

Various problems are inherent in the latter type of linear motor already known in the art. First, the polycrystalline Terfenol-D material must be ground into a near perfect circular cross-section in order to establish a uniform tight fit within the support tube. Second, any wear between the outer cylindrical surface of the movable element and the inner wall surface of the support tube renders the motor inoperative. Thirdly, motor performance is limited by its pre-stressed condition.

It is therefore an important object of the present invention to provide a linear motor of the type having the desirable properties of a crystalline Terfenol-D magnetostrictive element, but avoids the aforementioned problems associated therewith and meets the high levels of performance necessary for high power micropositioners, injection valves, micrometering valves and other devices relying on accurate linear motion.

SUMMARY OF THE INVENTION

In accordance with the present invention, twinned single Terfenol-D is selected as the magnetostrictive material for the active longitudinal element of a linear motor with its [112] crystalline axis substantially aligned with the element axis in the direction of motion to improve linear magnetostriction under an applied magnetic field of lowered energy. The properties of the selected magnetostrictive material are such as to render magnetostriction perpendicular to the motion axis non-uniform establishing a preferential axis of maximum contraction extending at right angles through flat surfaces on the movable element to which slide bearing clamping forces are restrictively applied for reduced wear. The slide bearing forces are applied through support plates of a clamping device to the flat surfaces of the movable element on opposing sides thereof while the other two opposing sides remain unencumbered. The bias of prestressed springs are exerted on the flat slide bearing surfaces to regulate continued application of the clamping forces as the movable element contracts transverse to the direction of elongation in response to a relatively low triggering magnetic field applied by means of an electromagnetically energized coil. An optimum bias field is maintained by means of such coil in the static condition of the motor. A significant reduction in heat and conservation of energy is thereby realized through the linear motor arrangement of the present invention in addition to meeting the high performance demands aforementioned.

BRIEF DESCRIPTION OF DRAWING FIGURE

Other objects, advantages and novel features of the invention will become apparent from the following detailed description of the invention when considered in conjunction with the accompanying drawing wherein.

DETAILED DESCRIPTION OF PREFERRED EMBODIMENT

Studies have established that the compound $Tb_x Dy_{1-x} Fe_y$, referred to as Terfenol-D, possesses an unusually large magnetostrictive strain. A large positive magnetostrictive strain or expansive deformation for Terfenol-D at room temperature has been found to be along the [112] crystalline axis of single crystal material. Single crystal Terfenol-D material may be formed into axially elongated rods by growth which occurs in the direction of its crystalline axis perpendicular to parallel dendrite sheets. The single crystals of Terfenol-D thus contain parallel sets of twin boundaries parallel to the [112] crystalline axis by reason of which the crystals are referred to as twinned single crystals.

Large jumps in magnetostriction, referred to as "burst effects", have been observed in twinned single Terfenol-D crystals subjected to magnetic fields parallel to the crystalline axis. Because of such magnetostriction jumping phenomenon, only a moderate triggering magnetic field (superimposed on a static bias field) is required to transfer energy between magnetic and mechanical states. By appropriate magnetic heat treatment of the twinned single crystals, the magnetostrictive strain along the crystalline axis is effectively increased under relatively low applied compressive stress.

In regard to magnetostrictive strain transverse to the crystalline axis during the aforementioned burst effects characterized by jumps in the axially orientated magnetostriction, almost simultaneous moment rotation occurs causing a jump in negative magnetostrictive deformation in the form of contraction of the Terfenol-D in a preferential transverse direction perpendicular to the crystalline axis while opposite expansion occurs in another transverse direction. In accordance with the present invention the direction in which the transverse negative magnetostriction occurs coincides with the direction in which clamping forces are exerted to resist motion of the magnetostrictive element parallel to interfacing contact planes thereon.

Figure 1:
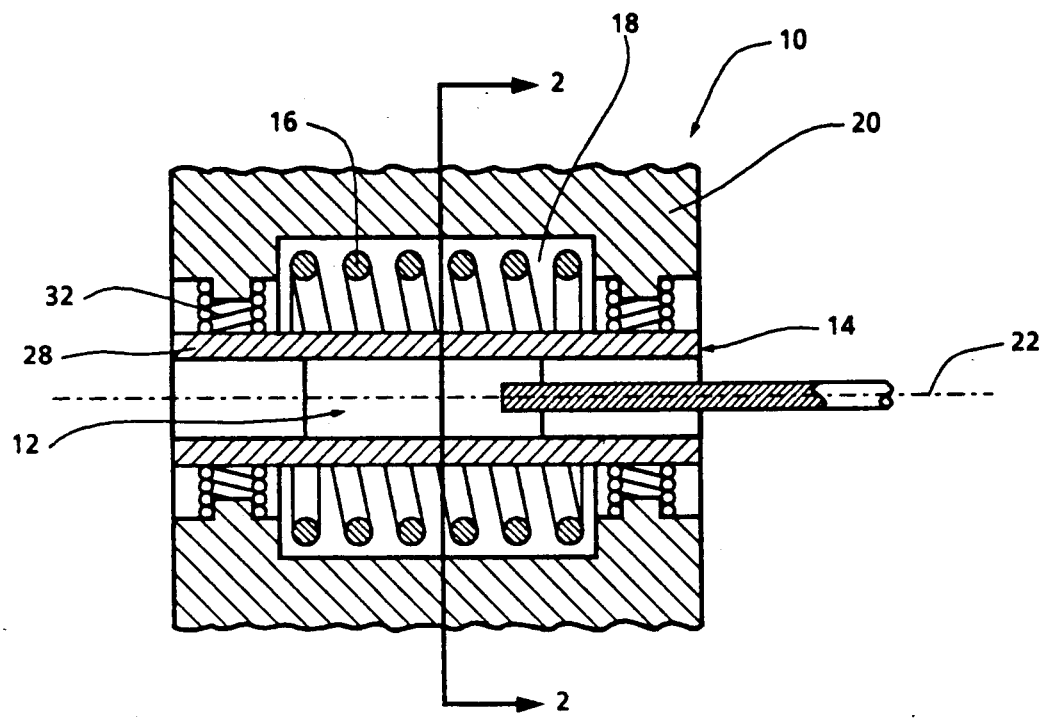
FIG. 1 is a side section view through a linear motor constructed in accordance with one embodiment of the invention.
Figure 2:
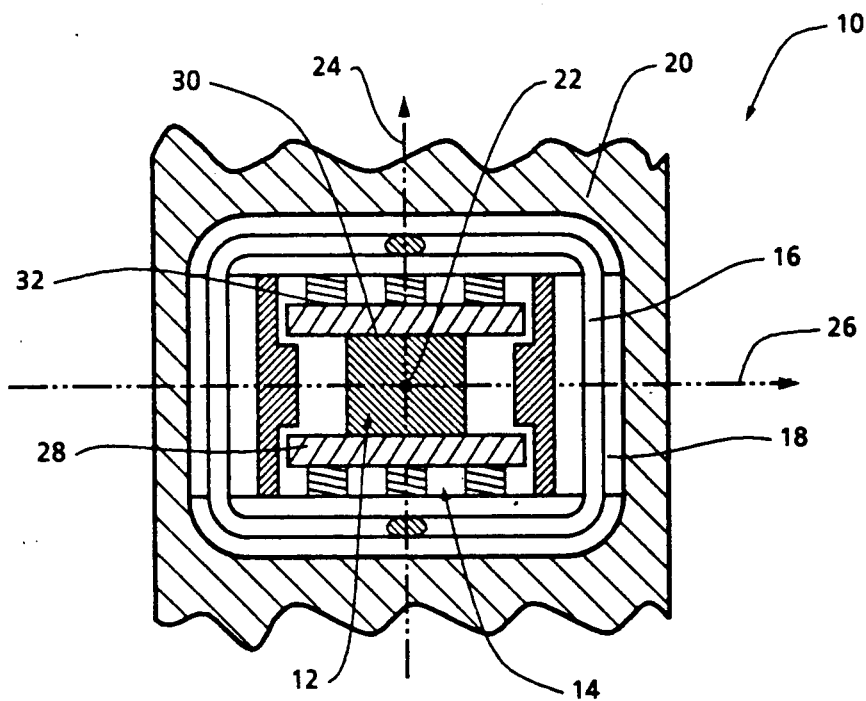
FIG. 2 is a transverse section view taken substantially through a plane indicated by section line 2—2 in FIG. 1.

FIGS. 1 and 2 illustrate by way of example a linear motor, generally referred to by reference number 10, constructed in accordance with an embodiment of the present invention having an axially elongated active rod element 12. The rod element is made of single crystal type Terfenol-D material having a chemical composition $Tb_{03}Dy_{07}Fe_{109}$ and is in slide bearing contact with a stator assembly, generally referred to by reference number 14. The stator assembly includes an electromagnetically energized solenoid coil 16 operatively positioned about the rod 12 within a container cavity 18 formed in a stator housing 20.

The [112] crystalline axis of the twinned single crystal Terfenol-D rod 12 is substantially coincident (within 2 degrees) with the longitudinal rod axis 22 while the magnetic field generating coil 16 is axially aligned therewith to magnetostrictively cause axial elongation or strain of the rod 12 along its axis 22 while it is under transverse compressive bearing stress. The magnetostrictive behavior of the rod 12 in the axial direction is accompanied by moment rotation about axis 22 causing magnetostriction transverse to axis 22. Such transverse magnetostriction varies between maximum negative magnetostriction along preferential axis 24 and maximum positive magnetostriction angularly spaced from axis 24 along expansion axis 26 as shown in FIG. 2. In accordance with the present invention, the accompanying compressive stress is established in the rod 12 by the clamping forces transmitted along axis 24 through slide bearing support plates 28 at the locations of maximum negative transverse magnetostriction. As shown in FIG. 2, such support plates 28 are flat or planar shaped and in sliding contact with planar surfaces 30 on opposing sides of the rod 12, which is rectangular in cross-section. The slide bearing type of clamping forces transmitted to surfaces 30 of the rod will be regulated by pre-stressed coil springs 32 mounted by the stator housing 20 in engagement with the support plates 28 adjacent the opposite longitudinal ends thereof, for example, as shown in FIG. 1.

Figure 3:
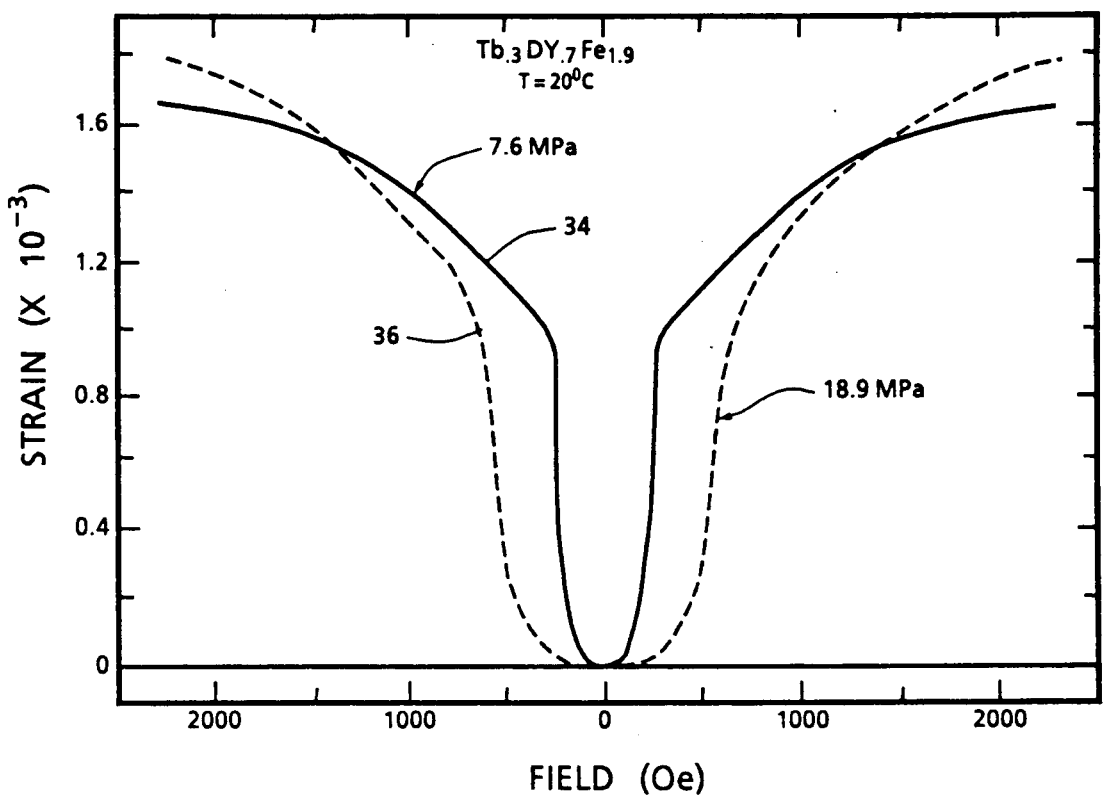
FIG. 3 is a graphical illustration depicting magnetostriction strain of the active element of the linear motor under different compressive stresses.
Figure 4:
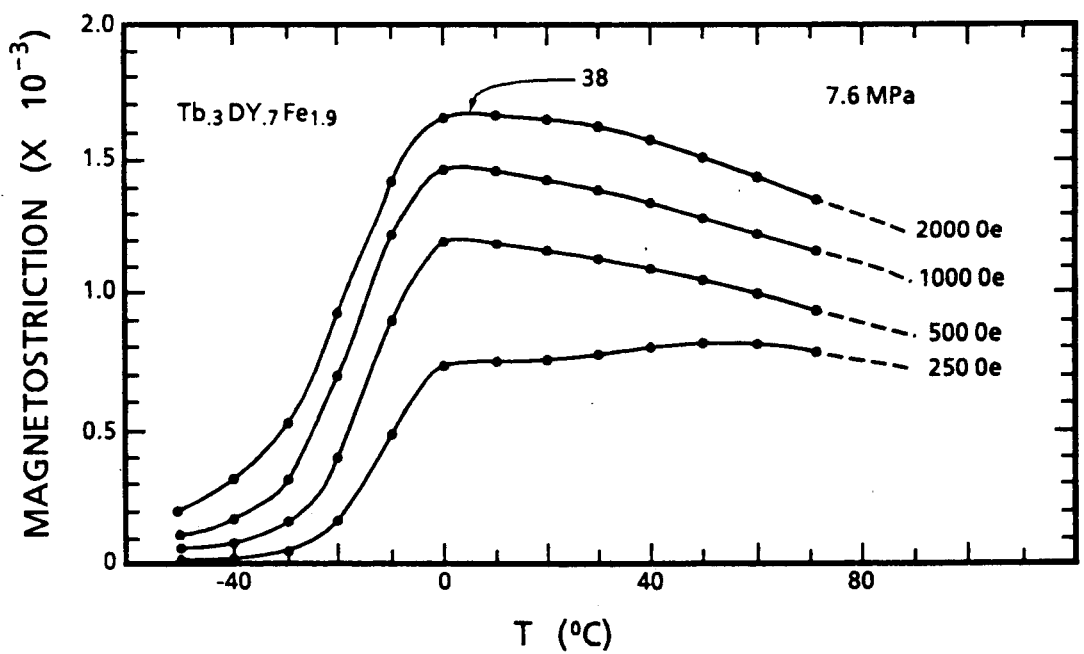
FIG. 4 is a graphical illustration depicting magnetostriction of the active element under different magnetic field strengths and different temperatures.
Figure 5:
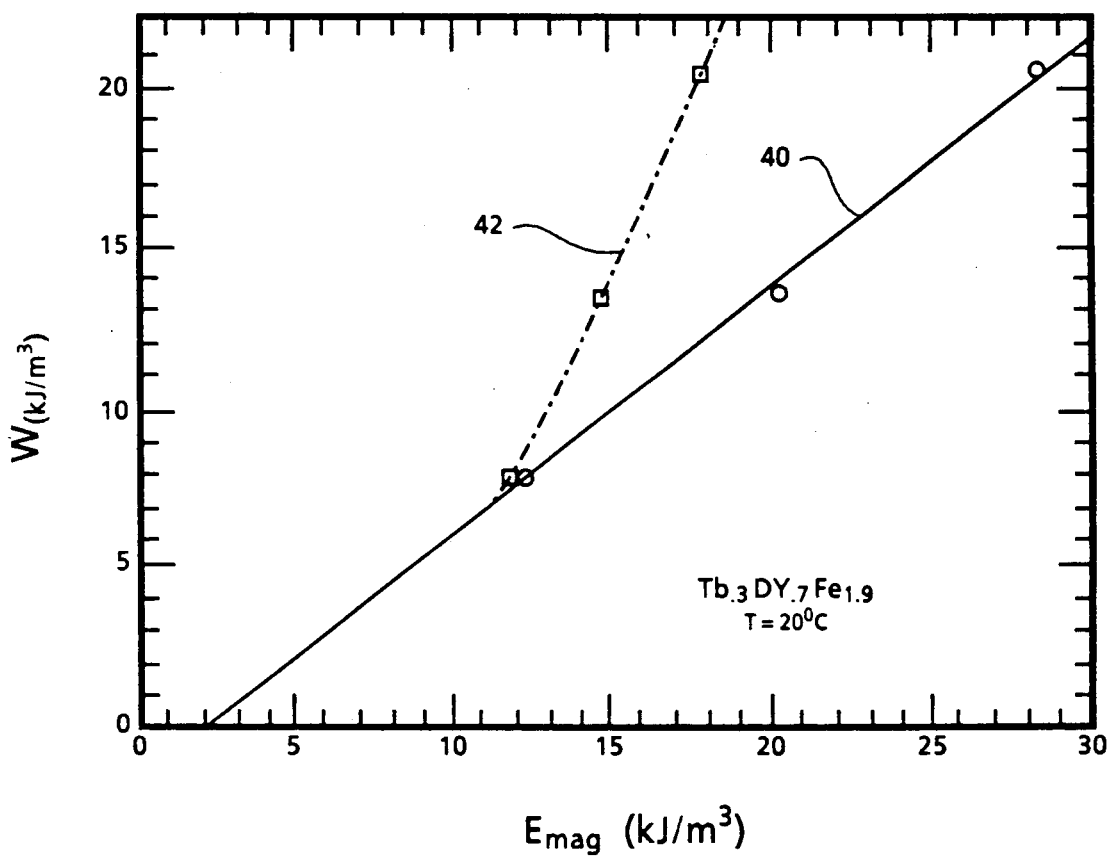
FIG. 5 is a graphical illustration depicting the relationship of mechanical output energy through the active element of the linear motor to the input electromagnetic energy, under temperature conditions of 20° C.

The magnetostrictive jumping phenomenon or burst effect, hereinbefore referred to, occurs with respect to the single crystal Terfenol-D rod 12 as evidenced by the magnetostrictive strain curves 34 and 36 in the graph of FIG. 3 when the magnetization field exceeds a relatively low trigger level of 100 Oe, for example, at a temperature of 20° C. and while the rod is under compressive stress. Thus, the curves 34 and 36 demonstrate that as the compressive stress increases from 7.6 to 18.9 MPa, a larger external field must be applied to produce expansion work against load. Curves 38 in FIG. 4, on the other hand, characterize the onset of the magnetostrictive state of the rod under conditions of a compressive stress of 7.6 MPa and magnetization fields between 250 and 2000 Oe. Such magnetostrictive states effectively extend beyond a peak value at 0° C. to 60° C. as depicted by the curves in FIG. 4. FIG. 5 graphically illustrates that because of the magnetization jumping or burst effect under the conditions indicated, only a moderate triggering value of the magnetic field superimposed on a static bias field, is required to transfer energy between magnetic and mechanical states. Thus, if an optimum bias magnetic field is introduced, the ratio of mechanical to magnetic energy reflected by curve 40 may be increased to that reflected by curve 42 at 20° C., for example, as shown in FIG. 5. Large amounts of energy may accordingly be transferred from the internal magnetic state stored in the active rod element 12 to the external mechanical state by a small applied triggering magnetic field.

With reference to the foregoing description, the motor 10 in its static condition has a magnetic bias field established through the coil 16 and maintained therein while the rod 12 is restrictively gripped or clamped on opposing sides thereof between the support plates 28 with the other opposing sides unencumbered as shown in FIG. 2. As a triggering magnetic field is applied, the rod 12 is magnetostrictively elongated in the axial direction of axis 22 as shown in FIG. 1 while maximum negative transverse contraction occurs along axis 24 as shown in FIG. 2. Such transverse contraction of the rod will accordingly reduce the slide bearing clamping forces exerted thereon through the spring biased support plates 28, regulated by the pre-stressed condition of the coil springs 32. Positive transverse magnetostriction along expansion axis 26 as shown in FIG. 2 simultaneously occurs but does not affect the axial elongation of the rod since slide bearing contact therewith is limited to surfaces 30 perpendicular to the axis 24 and parallel to axis 26. The initial static compressive stress established in the rod under the bias of springs 32 is accordingly reduced during motor operation to controllably prolong the burst effect until axial magnetostriction of the rod is completed to execute the desired motor stroke with accuracy.

The selection of twinned single crystal type Terfenol-D as the magnetostrictive material for the active element of the motor was found to exhibit a 20% improvement over a polycrystalline type of Terfenol-D in its linear magnetostriction as well to enable lowering of the applied magnetic field to only 300 Oersteds for example. Also, the properties of the twinned signal crystal Terfenol-D accounts for the non-uniform nature of magnetostriction perpendicular to the direction of motion along the rod axis 22 and the availability of maximum negative magnetostriction along axis 24 perpendicular to the flat slide bearing surfaces 30 of the rod along which the rod shrinks from the spring biased support plates 28 to reduce wear and regulate continued application of slide bearing forces during motor operation. Since the opposing sides of the rod 12 perpendicular to the axis 26 remain unencumbered as aforementioned, additional longitudinal prestressing means along along axis 22 including stress bolts (not shown), may be provided according to other contemplated embodiments for successful motor operation under certain external load conditions.

Numerous other modifications and variations of the present invention are possible in light of the foregoing teachings. It is therefore to be understood that within the scope of the appended claims the invention may be practiced otherwise than as specifically described.

What is claimed is:

1. In a motor having a stator, an active element under compressive stress of bearing forces accompanying frictional sliding contact therewith and means applying a magnetic field for magnetostrictive elongation of the active element in an axial direction and transverse magnetostriction under said compressive stress, the improvement residing in said active element being made of a magnetostrictive material with properties rendering said transverse magnetostriction non-uniform about said axial direction, said stator including support means for limiting said frictional sliding contact to a preferential location on the active element at which the transverse magnetostriction is negative and prestressed means for regulating reduction in the bearing forces exerted at said preferential location during said magnetostrictive elongation of the active element.

2. The improvement as defined in claim 1 wherein said magnetostrictive material is twinned single crystal Terfenol-D having a crystalline axis substantially aligned with said axial direction.

3. The improvement as defined in claim 2 wherein said transverse magnetostriction varies between maximum contraction at the preferential location on the active element and expansion at other locations angularly spaced therefrom.

4. The improvement as defined in claim 1 wherein said support means includes a bearing plate having a planar surface on which said sliding frictional contact is established at the preferential location under bias of the prestressed means.

5. The improvement as defined in claim 4 wherein said transverse magnetostriction varies between maximum contraction at the preferential location on the active element and expansion at other locations angularly spaced therefrom.

6. The improvement as defined in claim 1 wherein said transverse magnetostriction varies between maximum contraction at the preferential location on the active element and expansion at other locations angularly spaced therefrom.

7. In a motor having a stator, an active element under compressive stress of bearing forces accompanying frictional sliding contact therewith and means applying a magnetic field for magnetostrictive elongation of the active element in an axial direction and transverse magnetostriction under said compressive stress, the improvement residing in said active element being made of twinned single crystal Terfenol-D having a crystalline axis substantially aligned with said axial direction and said stator including support means for limiting said frictional sliding contact to a preferential location on the active element at which the transverse magnetostriction is negative and prestressed means engageable with the support means for regulating reduction in the bearing forces exerted at said preferential location.

8. The improvement as defined in claim 7 wherein said transverse magnetostriction varies between said negative at the preferential location on the active element and positive transverse magnetostriction at locations unencumbered by said forces angularly spaced from the preferential location.

9. The improvement as defined in claim 7 wherein said support means includes a bearing plate having a planar surface on which said sliding frictional contact is established at the preferential location.

10. In a motor having an active element under stress accompanying frictional sliding contact therewith and means applying a magnetic field for magnetostrictive elongation of the active element and magnetostriction transverse to said elongation, the improvement residing in said active element being made of a magnetostrictive material with properties rendering said magnetostriction transverse to the elongation non-uniform, and prestressed means acting on the active element through said sliding contact for controllably maintaining the active element under said stress transverse to and during said elongation thereof.

11. The improvement as defined in claim 10 wherein said magnetostrictive material is twinned single crystal Terfenol-D having a crystalline axis substantially aligned with said axial direction.

12. The improvement as defined in claim 10 wherein said transverse magnetostriction varies between maximum negative contraction and maximum expansion.

13. In a motor having an active element and means applying magnetic field for magnetostrictive elongation and transverse deformation of the active element, said magnetostrictive transverse deformation varying between maximum contraction and maximum expansion, and prestressed means for controllably maintaining the active element under stress exerted transversely on the active element only at locations thereon at which the maximum contraction of the magnetostrictive transverse deformation occurs.

14. The improvement as defined in claim 13 wherein said magnetostrictive material is twinned single crystal Terfenol-D having a crystalline axis along which said magnetostrictive elongation occurs.

15. In a motor having a stator, a magnetostrictive element having flat bearing surfaces in slide bearing contact with the stator and coil means for applying a magnetic field orientated substantially parallel to said flat bearing surfaces of the element, the element being made of twinned single crystal Terfenol-D having a crystalline axis substantially parallel to said flat bearing surfaces.

16. The combination of claim 15 wherein said stator includes spring biased means for limiting said slide bearing contact to the flat bearing surfaces of the element.

* * * * *